(12) United States Patent
Hsieh et al.

(10) Patent No.: US 11,282,966 B2
(45) Date of Patent: Mar. 22, 2022

(54) SEMICONDUCTOR MATERIALS

(71) Applicant: Hewlett-Packard Development Company, L.P., Spring, TX (US)

(72) Inventors: Hsing-Hung Hsieh, Taipei (TW); Kuan-Ting Wu, Taipei (TW); Ann Alejandro Villegas, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/052,551

(22) PCT Filed: Mar. 6, 2019

(86) PCT No.: PCT/US2019/020993
§ 371 (c)(1),
(2) Date: Nov. 3, 2020

(87) PCT Pub. No.: WO2020/180322
PCT Pub. Date: Sep. 10, 2020

(65) Prior Publication Data
US 2021/0391476 A1     Dec. 16, 2021

(51) Int. Cl.
*H01L 27/105*     (2006.01)
*H01L 29/786*     (2006.01)

(52) U.S. Cl.
CPC ...... *H01L 29/78693* (2013.01); *H01L 27/105* (2013.01); *H01L 29/78648* (2013.01); *H01L 29/78696* (2013.01)

(58) Field of Classification Search
CPC .............. H01L 27/105; H01L 29/78693; H01L 29/78648; H01L 29/78696
(Continued)

(56) References Cited

U.S. PATENT DOCUMENTS 7,378,286 B2    5/2008   Hsu et al.
9,059,299 B2    6/2015   Steiger et al.
(Continued)

FOREIGN PATENT DOCUMENTS

TW    201431083 A    8/2014
TW    201732938 A    9/2017
(Continued)

*Primary Examiner* — Tong-Ho Kim
(74) *Attorney, Agent, or Firm* — Thorpe, North & Western (57) ABSTRACT

Semiconductor materials can include from about 11 at % to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal; from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal; from about 0.3 at % to about 18 at % of a semiconductivity controller including an element having a standard electrode potential from about −0.8 to about −3.05; and from about 45 at % to about 67 at % oxygen.

15 Claims, 4 Drawing Sheets

(58) Field of Classification Search
USPC .......................................................... 257/43
See application file for complete search history.

(56) References Cited

U.S. PATENT DOCUMENTS

| | | |
|---|---|---|
| 2007/0010061 A1 | 1/2007 | Forbes et al. |
| 2010/0301343 A1 | 12/2010 | Qiu et al. |
| 2011/0127579 A1 | 6/2011 | Yamazaki |
| 2012/0126223 A1* | 5/2012 | Maeng ................ H01L 29/7869 257/43 |
| 2012/0241734 A1 | 9/2012 | Honda et al. |
| 2013/0045567 A1 | 2/2013 | Zan et al. |
| 2017/0170208 A1 | 6/2017 | Yuan et al. |

FOREIGN PATENT DOCUMENTS

| | | |
|---|---|---|
| TW | 201737355 A | 10/2017 |
| WO | WO-2010096803 A2 | 8/2010 |
| WO | WO-2016076954 A1 | 5/2016 |
| WO | WO-2018004663 A1 | 1/2018 |
| WO | WO-2018004663 A1 | 1/2018 |
| WO | WO-2018236357 A1 | 12/2018 |

\* cited by examiner

SEMICONDUCTOR MATERIALS

BACKGROUND

Semiconductor materials have an electrical conductivity value falling between a conductor and an insulator. Many semiconductor materials are crystalline solids, such as crystalline silicon. In some examples, faults in the crystal structure can interfere with the semiconducting properties of the material. Nonetheless, semiconductor devices can have a variety of useful properties, such as passing current more easily in one direction than the other, variable resistance, sensitivity to light, sensitivity to temperature, etc. Further, the majority of electronics technology employs semiconductor materials, such as in transistors, integrated circuits, etc.

DETAILED DESCRIPTION

Many semiconductor materials, such as silicon, benefit from a high degree of crystallinity, as dislocations and other faults can interfere with the semiconducting properties of the material. However, some semiconductor materials, such as oxide-based semiconductors, can be amorphous. Compared to many semiconductors, oxide-based semiconductors can have high performance, a broad range of properties and applications, and low cost. In some cases, oxide-based semiconductor materials can suffer from uniformity and stability issues. The present disclosure describes oxide-based semiconductor materials and associated devices having high performance and a high degree of customization while maintaining good uniformity and stability.

In one example, a semiconductor material can include from about 11 atomic percent (at %) to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal; from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal; from about 0.3 at % to about 18 at % of a semiconductivity controller including an element having a standard electrode potential from about −0.8 to about −3.05; and from about 45 at % to about 67 at % oxygen. In some examples, the carrier mobility contributor and the amorphous phase stabilizer are present at an atomic ratio of from about 1:2 to about 50:1. In some additional examples, the carrier mobility contributor and the semiconductivity controller are present at an atomic ratio of from about 2:3 to about 150:1. In some further examples, the amorphous phase stabilizer and the semiconductivity controller are present at an atomic ratio of from about 1:30 to about 80:1. In some examples, the carrier mobility contributor is lead, and the amorphous phase stability is selected from indium, tin, cadmium, zinc, gallium, or a combination thereof. In other examples, the carrier mobility contributor is indium, tin, cadmium, or a combination thereof, and the amorphous phase stabilizer is zinc, gallium, or a combination thereof. In additional examples, the semiconductivity controller includes an alkali metal, an alkaline earth metal, a lanthanide, an actinide, or a combination thereof. In other examples, the semiconductivity controller includes a transition metal.

In another examples, a semiconductor device can include a drain electrode, a source electrode, a channel connecting the drain electrode and the source electrode, a gate electrode, and a dielectric material positioned between the gate electrode and the channel. The semiconductor material can include from about 11 at % to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal; from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal; from about 0.3 at % to about 18 at % of a semiconductivity controller including an element having a standard electrode potential from about −0.8 to about −3.05; and from about 45 at % to about 67 at % oxygen. In some examples, the semiconductor device has a bottom gate structure. In some other examples, the semiconductor device has a top gate structure. In some other examples, the semiconductor device has a double gate structure. In some further examples, the semiconductivity controller includes an alkali metal, an alkaline earth metal, a lanthanide, an actinide, a transition metal, or a combination thereof.

In another example, an electronic device can include a semiconductor device electrically integrated as part of the electronic device. The semiconductor device can include a drain electrode, a source electrode, a channel connecting the drain electrode and the source electrode, a gate electrode, and a dielectric material positioned between the gate electrode and the channel. The semiconductor material can include from about 11 at % to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal; from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal; from about 0.3 at % to about 18 at % of a semiconductivity controller including an element having a standard electrode potential from about −0.8 to about −3.05; and from about 45 at % to about 67 at % oxygen. In some examples, the electronic device can include a display, an amplifier, a memory device, a global positioning system (GPS) device, a server, a modem, a router, a personal computer, a laptop computer, a calculator, a tablet, a phone, a speaker, a television, a media player, a projector, a smart device, a remote control, or a combination thereof.

In addition to the examples described above, the semiconductor materials, semiconductor devices, and electronic devices will be described in greater detail below. It is also noted that when discussing the semiconductor materials, semiconductor devices, and electronic devices described herein, these relative discussions can be considered applicable to the other examples, whether or not they are explicitly discussed in the context of that example. Thus, for example, in discussing a carrier mobility contributor related to a semiconductor material, such disclosure is also relevant to and directly supported in the context of the semiconductor devices and electronic devices described herein, and vice versa.

Semiconductor Materials

In further detail, the semiconductor materials described herein can include a carrier mobility contributor. The carrier mobility contributor can have good carrier (e.g. electron or hole) transport properties. Generally, the carrier mobility contributor can include a metal that, when oxidized, has an electronic configuration of $(n-1)d^{10}ns^0$. This generally refers to the metals in groups 11 through 15 and periods (n) 4 through 6 of the periodic table (i.e. copper, zinc, gallium, germanium, arsenic, silver, cadmium, indium, tin, antimony, gold, mercury, thallium, lead, bismuth). However, in some examples, the carrier mobility contributor can also benefit from readily forming a metal oxide. As such, in some examples, the carrier mobility contributor also has a negative standard electrode potential (SEP). In further detail, of those metals previously listed, including lead, cadmium, indium, tin, zinc, and gallium, have a negative SEP. Thus, in some examples, the carrier mobility contributor can include lead, cadmium, indium, tin, zinc, or gallium. In some specific examples, the carrier mobility contributor can include lead, cadmium, indium, or tin. In some further examples, the carrier mobility contributor can be or include lead. In some other examples, the carrier mobility contributor can be or include cadmium, indium, tin, or a combination thereof.

The carrier mobility contributor can be present in the semiconductor material in a variety of amounts. Generally, the carrier mobility contributor can be present in the semiconductor material in an amount from about 11 at % to about 50 at % based on the total number of atoms in the semiconductor material. In some additional examples, the carrier mobility contributor can be present in the semiconductor material in an amount from about 15 at % to about 25 at %, from about 20 at % to about 30 at %, from about 25 at % to about 35 at %, from about 30 at % to about 40 at %, from about 35 at % to about 45 at %, or from about 40 at % to about 50 at % based on the total number of atoms in the semiconductor material.

The semiconductor materials can also include an amorphous phase stabilizer. Similar to the carrier mobility contributor, the amorphous phase stabilizer can also have good carrier transport properties and can include a metal that, when oxidized, has an electronic configuration of $(n-1)d^{10}ns^0$. Additionally, the amorphous phase stabilizer can also generally include a metal having a negative SEP (e.g. lead, cadmium, indium, tin, zinc, or gallium). The amorphous phase stabilizer can be present to help prevent the semiconductor material from crystallizing. As such, the amorphous phase stabilizer can generally be from a different period of the periodic table than the carrier mobility contributor to disrupt the crystalline structure of the carrier mobility contributor. In some specific examples, the amorphous phase stabilizer can be from a lower numbered period of the periodic table than the carrier mobility contributor. In some further examples, the amorphous phase stabilizer can be or include cadmium, indium, tin, zinc, gallium, or a combination thereof. In some examples, the amorphous phase stabilizer can include one of cadmium, indium, tin, zinc, or gallium. In some additional examples, the amorphous phase stabilizer can include two of cadmium, indium, tin, zinc, or gallium. In some additional specific examples, the amorphous phase stabilizer can be or include cadmium, indium, tin, or a combination thereof. In some examples, the amorphous phase stabilizer can include one of cadmium, indium, or tin. In some additional examples, the amorphous phase stabilizer can include two of cadmium, indium, or tin. In some other examples, the amorphous phase stabilizer can be or include zinc, gallium, or a combination thereof. In some examples, the amorphous phase stabilizer can include one of zinc, or gallium. In some additional examples, the amorphous phase stabilizer can include zinc and gallium.

The amorphous phase stabilizer can be present in the semiconductor material in a variety of amounts. Generally, the amorphous phase stabilizer can be present in the semiconductor material in an amount from about 0.6 at % to about 25 at % based on the total number of atoms in the semiconductor material. In some additional examples, the amorphous phase stabilizer can be present in the semiconductor material in an amount from about 1 at % to about 10 at %, from about 5 at % to about 15 at %, from about 10 at % to about 20 at %, or from about 15 at % to about 25 at % based on the total number of atoms in the semiconductor material.

The semiconductor materials can also include a semiconductivity controller component. The semiconductivity controller can help enhance the stability of the semiconductor materials and can help tune the semiconductive properties of the semiconductor materials. For example, the carrier mobility contributor and the amorphous phase stabilizer components are generally conductive materials unless oxidized. As such, the level of oxygen in the material can determine whether the material behaves more like a conductive material or semiconductor material. For example, where the level of oxygen in the semiconductor material is low, the semiconductor material may behave more similarly to a conductive material than a semiconductor material. Thus, the semiconductivity controller can help achieve and maintain a level of oxygen that promotes semiconductive properties in the semiconductor material. Accordingly, the semiconductivity controller can generally have a low standard electrode potential to help tune the amount of oxygen in the semiconductor material, for example. More specifically, the semiconductivity controller can generally have a standard electrode potential (SEP) from about −0.8 to about −3.05. In some specific examples, the semiconductivity controller can have an SEP of from about −1.0 to about −2.0, from about −1.5 to about −2.5, or from about −2.0 to about −3.0. The semiconductivity controller can also be used to tune a variety of other properties of the semiconductor material for various applications as well.

In some specific examples, the semiconductivity controller can include an alkali metal, an alkaline earth metal, a lanthanide, an actinide, a transition metal, a metalloid, a post-transition metal, or a combination thereof. In some examples, the semiconductivity controller can include an alkali metal, an alkaline earth metal, a lanthanide, an actinide, a transition metal, a post-transition metal, or a combination thereof. In some other examples, the semiconductivity controller can include an alkali metal, an alkaline earth metal, a lanthanide, an actinide, a transition metal, a metalloid, or a combination thereof. In some additional examples, the semiconductivity controller can include an alkali metal, an alkaline earth metal, a lanthanide, an actinide, a transition metal, or a combination thereof. In some examples, the semiconductivity controller can include an alkali metal, an alkaline earth metal, a lanthanide, an actinide, or a combination thereof.

In some examples, the semiconductivity controller can include an alkali metal. Suitable alkali metal metals can include lithium (SEP −3.04), sodium (SEP −2.71), potassium (SEP −2.93), rubidium (SEP −2.92), cesium (SEP −2.92), francium (SEP −2.92), or a combination thereof.

In some additional examples, the semiconductivity controller can include an alkaline earth metal. Suitable alkaline earth metals can include beryllium (SEP −1.97), magnesium (SEP −2.66), calcium (SEP −2.84), strontium (SEP −2.89), barium (SEP −2.92), radium (SEP −2.92), or a combination thereof.

In still additional examples, the semiconductivity controller can include a lanthanide. Suitable lanthanides can include lanthanum (SEP −2.38), cerium (SEP −2.34), praseodymium (SEP −2.35), neodymium (SEP −2.2), promethium (SEP −2.29), samarium (SEP −2.67), europium (SEP −2.8), gadolinium (SEP −2.28), terbium (SEP −2.31), dysprosium (SEP −2.2), holmium (SEP −2.33), erbium (SEP −2.32), thulium (SEP −2.3), ytterbium (SEP −2.8), lutetium (SEP −2.3), or a combination thereof.

In some further examples, the semiconductivity controller can include an actinide. Suitable actinides can include plutonium (SEP −1.2), americium (SEP −1.95), curium (SEP −1.2), berkelium (SEP −1.6), californium (SEP −2.1), einsteinium (SEP −2.2), fermium (SEP −2.37), mendelevium (SEP −2.4), nobelium (SEP −2.5), lawrencium (SEP −2.0), or a combination thereof.

In still further examples, the semiconductivity controller can include a transition metal. Suitable transition metals can include scandium (SEP −2.03), titanium (SEP −1.63), vanadium (SEP −1.13), chromium (SEP −0.9), manganese (SEP −1.18), yttrium (SEP −2.37), zirconium (SEP −1.55), niobium (SEP −1.1), hafnium (SEP −1.7), tantalum (SEP −0.81), or a combination thereof.

In yet further examples, the semiconductivity controller can include a metalloid. Suitable metalloids can include boron (SEP −0.89), silicon (SEP −0.91), or a combination thereof.

In some additional examples, the semiconductivity controller can include a post-transition metal. Suitable post-transition metals can include aluminum (SEP −1.68).

In some specific examples, the semiconductivity controller can include lithium, sodium, potassium, rubidium, cesium, francium, beryllium, magnesium, calcium, strontium, barium, radium, lanthanum, cerium, praseodymium, neodymium, promethium, samarium, europium, gadolinium, terbium, dysprosium, holmium, erbium, thulium, ytterbium, lutetium, plutonium, americium, curium, berkelium, californium, einsteinium, fermium, mendelevium, nobelium, lawrencium, scandium, titanium, vanadium, chromium, manganese, yttrium, zirconium, niobium, hafnium, tantalum, boron, silicon, aluminum, or a combination thereof. In some specific examples, the semiconductivity controller can include one of lithium, sodium, potassium, rubidium, cesium, francium, beryllium, magnesium, calcium, strontium, barium, radium, lanthanum, cerium, praseodymium, neodymium, promethium, samarium, europium, gadolinium, terbium, dysprosium, holmium, erbium, thulium, ytterbium, lutetium, plutonium, americium, curium, berkelium, californium, einsteinium, fermium, mendelevium, nobelium, lawrencium, scandium, titanium, vanadium, chromium, manganese, yttrium, zirconium, niobium, hafnium, tantalum, boron, silicon, or aluminum. In some further examples, the semiconductivity controller can include two of lithium, sodium, potassium, rubidium, cesium, francium, beryllium, magnesium, calcium, strontium, barium, radium, lanthanum, cerium, praseodymium, neodymium, promethium, samarium, europium, gadolinium, terbium, dysprosium, holmium, erbium, thulium, ytterbium, lutetium, plutonium, americium, curium, berkelium, californium, einsteinium, fermium, mendelevium, nobelium, lawrencium, scandium, titanium, vanadium, chromium, manganese, yttrium, zirconium, niobium, hafnium, tantalum, boron, silicon, or aluminum.

The semiconductivity controller can be present in the semiconductor material in a variety of amounts. Generally, the semiconductivity controller can be present in the semiconductor material in an amount from about 0.3 at % to about 18 at % based on the total number of atoms in the semiconductor material. In some additional examples, the semiconductivity controller can be present in the semiconductor material in an amount from about 0.5 at % to about 5 at %, from about 1 at % to about 8 at %, from about 5 at % to about 12 at %, or from about 8 at % to about 16 at % based on the total number of atoms in the semiconductor material.

As discussed previously, the amount of oxygen in the semiconductor material can affect the semiconductive properties of the semiconductor material. For example, depending on the valencies or oxidation states of the carrier mobility contributor, the amorphous phase stabilizer, and the semiconductivity controller, various amounts of oxygen can be employed to achieve a suitable semiconductor material. Generally, the amount of oxygen present in the semiconductor material can approach an amount suitable to fill the valencies of the carrier mobility contributor, the amorphous phase stabilizer, and the semiconductivity controller. Generally, the amount of oxygen in the semiconductor material can be from about 45 at % to about 67 at % based on the total number of atoms in the semiconductor material. For example, where the carrier mobility contributor is cadmium, the amorphous phase stabilizer is zinc, and the semiconductivity controller is magnesium, the amount of oxygen can approach 50 at % (e.g. from about 45 at % to about 50 at %, for example). As another example, where the carrier mobility contributor is lead, the amorphous phase stabilizer is tin, and the semiconductivity controller is silicon, the amount of oxygen can approach 67 at % (e.g. from about 62 at % to about 67 at %, for example). In some specific examples, the amount of oxygen can be from about 45 at % to about 55 at %, from about 50 at % to about 60 at %, or from about 55 at % to about 65 at % based on the total number of atoms in the semiconductor material.

The carrier mobility contributor, the amorphous phase stabilizer, and the semiconductivity controller can be present in the semiconductor material in a variety of atomic ratios. In some examples, the carrier mobility contributor and the amorphous phase stabilizer can be present in the semiconductor material at an atomic ratio of from about 1:2 to about 50:1 (carrier mobility contributor:amorphous phase stabilizer). In other examples, the carrier mobility contributor and the amorphous phase stabilizer can be present in the semiconductor material at an atomic ratio of from about 2:3 to about 40:1, from about 1:1 to about 30:1, from about 3:2 to about 20:1, or from about 2:1 to about 10:1 (carrier mobility contributor:amorphous phase stabilizer).

In some additional examples, the carrier mobility contributor and the semiconductivity controller can be present in the semiconductor material at an atomic ratio of from about 2:3 to about 150:1 (carrier mobility contributor: semiconductivity controller). In some additional examples, the carrier mobility contributor and the semiconductivity controller can be present in the semiconductor material at an atomic ratio of from about 1:1 to about 120:1, from about 3:2 to about 100:1, from about 2:1 to about 80:1, from about 3:1 to about 60:1, from about 4:1 to about 40:1, or from about 5:1 to about 20:1 (carrier mobility contributor:semiconductivity controller).

In yet additional examples, the amorphous phase stabilizer and the semiconductivity controller can be present in the semiconductor material at an atomic ratio of from about 1:30 to about 80:1 (amorphous phase stabilizer:semiconductivity controller). In still other examples, the amorphous phase stabilizer and the semiconductivity controller can be present in the semiconductor material at an atomic ratio of from about 1:25 to about 50:1, from about 1:20 to about 40:1, from about 1:15 to about 30:1, from about 1:10 to about 20:1, from about 1:5 to about 10:1, or from about 1:2 to about 2:1.

Figure 1:
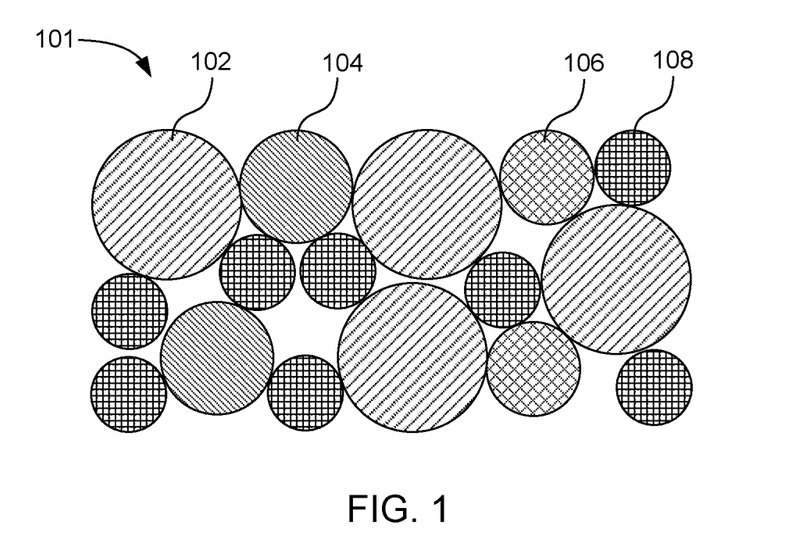
FIG. 1 is a schematic representation of a semiconductor material in accordance with the present disclosure.

One example of a semiconductor material 101 is illustrated in FIG. 1. The semiconductor material can include a carrier mobility contributor 102, an amorphous phase stabilizer 104, a semiconductivity controller 106, and oxygen 108. It is noted that the different components are not drawn to scale, may not be drawn in an expected relationship, or the like. FIG. 1 is provided for illustrative purposes for understanding aspects of an example herein.

Semiconductor Devices

The semiconductor materials described herein can be included in a variety of semiconductor devices. In some examples, the semiconductor devices can include a drain electrode, a source electrode, a channel connecting the drain electrode and the source electrode, a gate electrode, and a dielectric material positioned between the gate electrode and the channel.

The drain electrode can include or be formed of a variety of materials. In some examples, the drain electrode can include or be formed of a metal, such as aluminum, titanium, copper, nickel, silver, molybdenum, tungsten, tantalum, the like, or a combination thereof. In some examples, the drain electrode can include or be formed of a transparent conductor material, such as indium tin oxide (ITO), $Cd_2SnO_4$, $ZnSnO_3$, $Zn_2SnO_4$, doped $SnO_2$, doped ZnO, doped $In_2O_3$, the like, or a combination thereof. The drain electrode can be formed using a variety of processes, such as spray pyrolysis, sputtering, chemical vapor deposition (CVD), pulsed laser deposition, physical layer deposition (PVD), atomic layer deposition (ALD), or the like. The dimensions of the drain electrode are not particularly limited and can depend on the particular design and intended use of the semiconductor device. In some non-limiting examples, the drain electrode can have a thickness of from about 10 nanometers (nm) to about 1000 nm, or from about 50 nm to about 500 nm, or from about 20 nm to about 200 nm.

The source electrode can also include or be formed of a variety of materials. In some examples, the source electrode can include or be formed of a metal, such as aluminum, titanium, copper, nickel, silver, molybdenum, tungsten, tantalum, the like, or a combination thereof. In some examples, the source electrode can include or be formed of a transparent conductor material, such as indium tin oxide (ITO), $Cd_2SnO_4$, $ZnSnO_3$, $Zn_2SnO_4$, doped $SnO_2$, doped ZnO, doped $In_2O_3$, the like, or a combination thereof. In some examples, the source electrode can be formed of or include the same material as the drain electrode. In other examples, the source electrode and the drain electrode can include or be formed of different materials. The source electrode can be formed using a variety of processes, such as spray pyrolysis, sputtering, CVD, pulsed laser deposition, PVD, ALD, or the like. The dimensions of the source electrode are not particularly limited and can depend on the particular design and intended use of the semiconductor device. In some non-limiting examples, the source electrode can have a thickness of from about 10 nm to about 1000 nm, or from about 50 nm to about 500 nm, or from about 20 nm to about 200 nm.

The gate electrode can likewise include or be formed of a variety of materials. In some examples, the gate electrode can include or be formed of a metal, such as indium, tin, aluminum, titanium, copper, nickel, silver, molybdenum, tungsten, tantalum, the like, or a combination thereof. In some examples, the gate electrode can include or be formed of a transparent conductor material, such as indium tin oxide (ITO), $Cd_2SnO_4$, $ZnSnO_3$, $Zn_2SnO_4$, doped $SnO_2$, doped ZnO, doped $In_2O_3$, the like, or a combination thereof. In some examples, the gate electrode can include or be formed of the same material as the drain electrode, the source electrode, or both. In other examples, the gate electrode can be formed of or include different materials from the drain electrode, the source electrode, or both. The gate electrode can be formed using a variety of processes, such as spray pyrolysis, sputtering, CVD, pulsed laser deposition, PVD, ALD, or the like. The dimensions of the gate electrode are not particularly limited and can depend on the particular design and intended use of the semiconductor device. In some non-limiting examples, the gate electrode can have a thickness of from about 10 nm to about 1000 nm, or from about 50 nm to about 500 nm, or from about 20 nm to about 200 nm.

The gate dielectric can include or be formed of a variety of dielectric materials. Non-limiting examples can include silicon dioxide ($SiO_2$), silicon nitride ($Si_3N_4$), aluminum oxide ($Al_2O_3$), tantalum pentoxide ($Ta_2O_5$), hafnium(IV) oxide ($HfO_2$), Zirconium(IV)oxide ($ZrO_2$), strontium titanate (ST), barium strontium titanate (BST), lead zirconium titanate (PZT), strontium bismuth tantalate (SBT), bismuth zirconium titanate (BZT), magnesium oxide (MgO), polymeric dielectric materials (e.g. polyvinylidene difluoride (PVDF), polyimide, fluorinated polyimide, polyethylene, polystryrene, etc.), other organic dielectric materials, the like, or a combination thereof. In some examples, the gate dielectric can include or be formed of a uniform or substantially uniform material. In other examples, the gate dielectric can be formed of a gradient material (e.g. having a changing concentration of a material constituent from one side to the other). In still other examples, the gate dielectric can include or be formed of layers of different materials. The gate dielectric can be formed using a variety of processes, such as PVD, CVD, ALD, evaporation, sputtering, pulsed laser deposition, spray pyrolysis, the like, or a combination thereof. The dimensions of the gate dielectric are not particularly limited and can depend on the particular design and intended use of the semiconductor device. In some non-limiting examples, the gate dielectric can have a thickness of from about 10 nm to about 1000 nm, from about 50 nm to about 500 nm, from about 20 nm to about 200 nm, about 30 nm to about 300 nm, or from about 40 nm to about 400 nm.

As described previously, the channel can be formed of a semiconductor material as described herein. The channel can be formed using a variety of techniques, such as spray pyrolysis, sputtering, CVD, pulsed laser deposition, PVD, ALD, or the like. The dimensions of the channel are also not particularly limited and can depend on the particular design and intended use of the semiconductor device. In some non-limiting examples, the channel can have a thickness of from about 10 nm to about 1000 nm, from about 50 nm to about 500 nm, from about 20 nm to about 200 nm, about 30 nm to about 300 nm, or from about 40 nm to about 400 nm.

The semiconductor devices can also include a substrate. A variety of suitable substrate materials can be employed in the semiconductor devices. Non-limiting examples can include silicon wafers, glass, quartz, metal foils, photoresist (e.g. SU-8), organic substrate materials (e.g. polydimethylsiloxane (PDMS), cyclic olefin copolymer (COC)), polymide (PI), or the like.

Figure 2A:
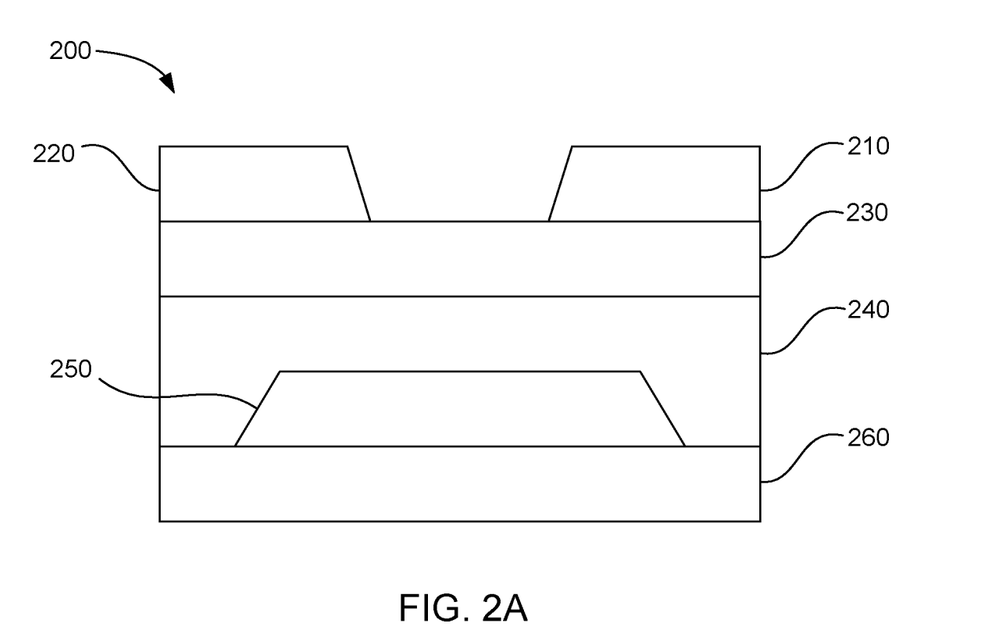
FIG. 2A is a schematic representation of a semiconductor device in accordance with the present disclosure.

The semiconductor devices can be designed in a variety ways. FIGS. 2A-2E illustrate a few non-limiting examples of possible semiconductor device structures. For example, FIG. 2A illustrates a semiconductor device 200 having a bottom-gate staggered or bottom-gate top-contact structure. In this particular example, a gate electrode 250 is formed on a substrate 260. A gate dielectric 240 is positioned between the gate electrode and a channel 230. A source electrode 220 and a drain electrode 210 are formed on and connected by the channel. In this example, the source electrode and the gate electrode are separated from the gate dielectric by the channel.

Figure 2B:
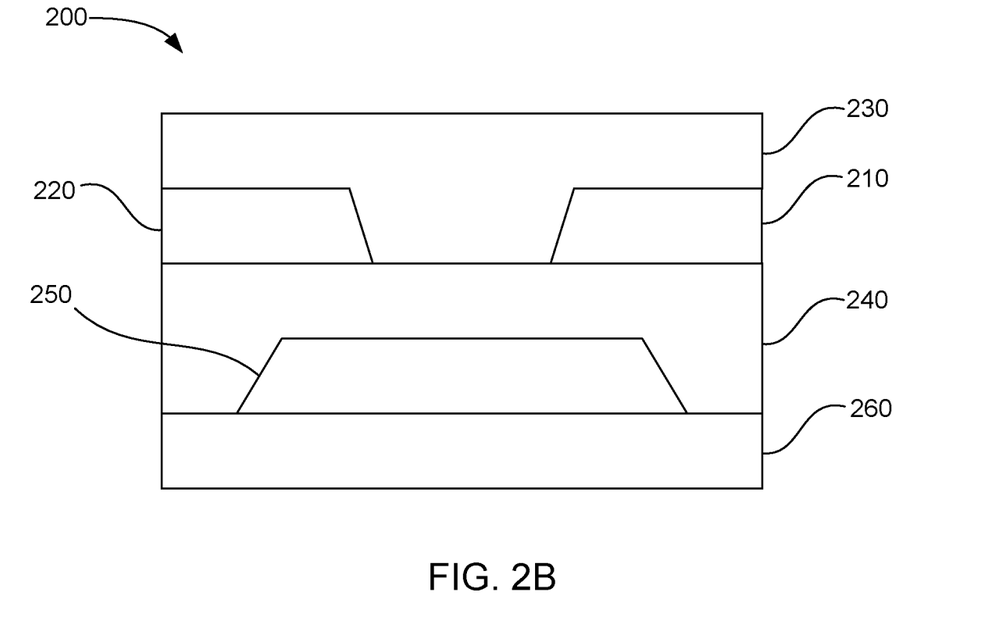
FIG. 2B is another schematic representation of a semiconductor device in accordance with the present disclosure.

FIG. 2B illustrates an example of a semiconductor device 200 having a bottom-gate coplanar or bottom-gate bottom-contact structure. In this example, the gate electrode 250 is formed on the substrate 260. The gate dielectric 240 is formed between the gate electrode and the channel 230. However, in this example, the source electrode 220 and the drain electrode 210 are also formed on the gate dielectric such that the source electrode, the drain electrode, and the channel contact the gate dielectric. Portions of the channel further extend above and are formed on the source electrode and the drain electrode, thus connecting the source electrode and the drain electrode.

Figure 2C:
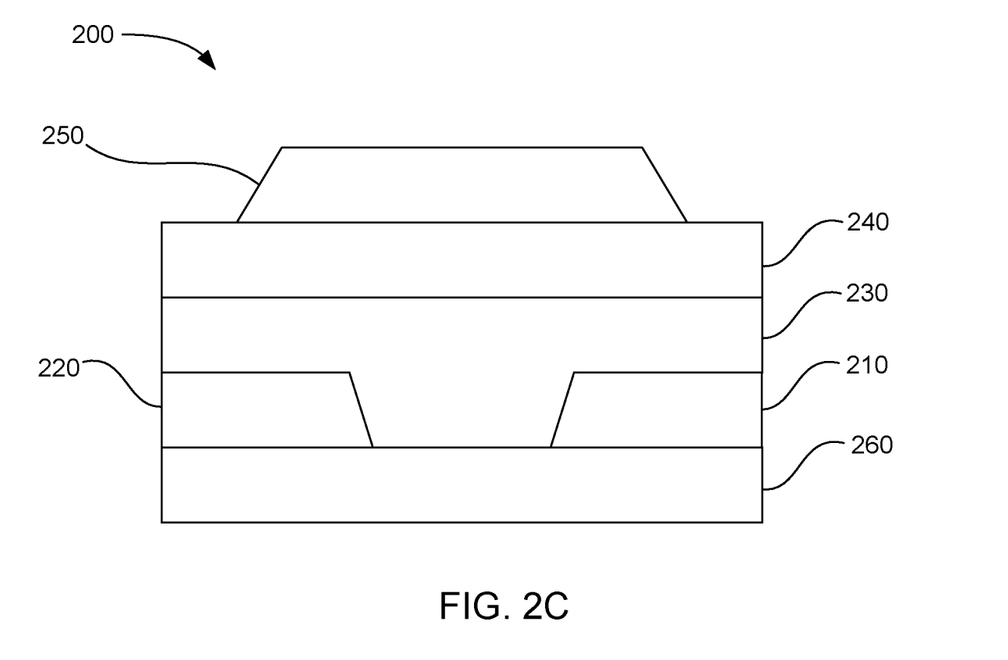
FIG. 2C is another schematic representation of a semiconductor device in accordance with the present disclosure.

FIG. 2C illustrates an example of a semiconductor device 200 having a top-gate staggered or a top-gate bottom-contact structure. In this example, the source electrode 220 and the drain electrode 210 are formed on the substrate 260. The channel 230 is partially formed on the substrate and partially formed on the source electrode and the drain electrode, thus connecting the source electrode and the drain electrode. The channel separates the source electrode and the drain electrode from the gate dielectric 240. The gate dielectric separates the channel from the gate electrode 250.

Figure 2D:
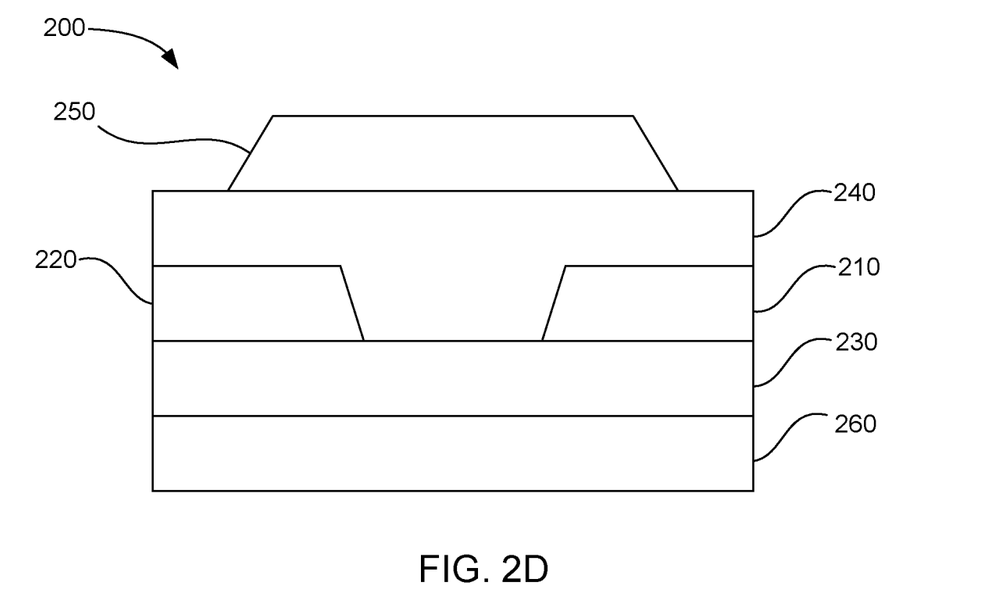
FIG. 2D is another schematic representation of a semiconductor device in accordance with the present disclosure.

FIG. 2D illustrates a semiconductor device 200 having a top-gate coplanar or top-gate top-contact structure. In this example, the channel 230 is formed on the substrate 260. The source electrode 220 and the drain electrode 210 are formed on the channel, the channel connecting the source electrode and the drain electrode. The gate dielectric 240 is formed partially on the channel and partially on the source electrode and the drain electrode such that the various channels, the source electrode, and the drain electrode contact the gate dielectric. The gate dielectric separates the channel from the gate electrode 250.

Figure 2E:
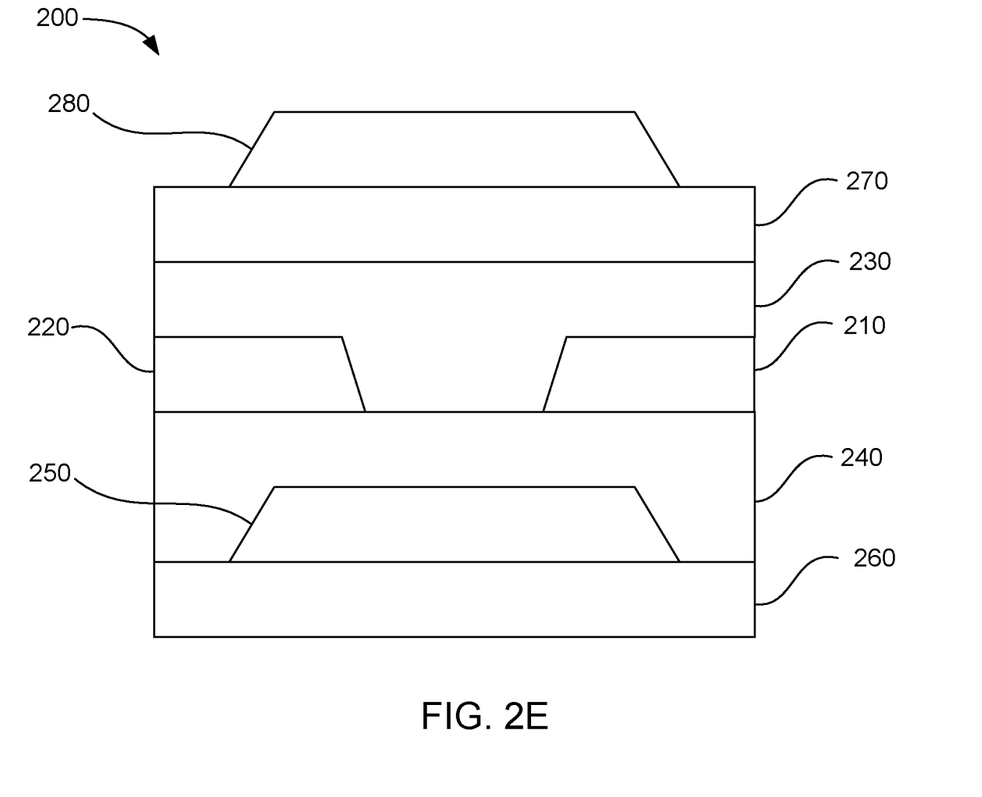
FIG. 2E is another schematic representation of a semiconductor device in accordance with the present disclosure.

FIG. 2E illustrates a semiconductor device 200 having a double gate structure. In this example, a first gate electrode 250 is formed on substrate 260. A first gate dielectric 240 separates the first gate electrode from the channel 230. In further detail of this example, the source electrode 220 and the drain electrode 210 are also formed on the first gate dielectric such that the source electrode, the drain electrode, and the channel are in contact with the first gate dielectric. However, while not illustrated, the source electrode and the drain electrode can alternatively be formed on the channel such that the channel separates the source electrode and the drain electrode from the first gate dielectric. In either case, the source electrode and the drain electrode are connected via the channel and the channel is separated from the first gate electrode by the first gate dielectric. Continuing on with the example illustrated in FIG. 2E, a second gate dielectric 270 is formed on the channel and separates the channel from a second gate electrode 280. The channel also separates the source electrode and the drain electrode from the second gate dielectric.

Thus, as can be seen in the examples illustrated in FIGS. 2A-2E, the semiconductor devices can have a variety of structures where a gate dielectric separates a channel from a gate electrode and where the channel connects the source electrode and the drain electrode. Various other structures and design considerations can also be employed depending on the particular application of the semiconductor device. As such, the semiconductor device can be a transistor (e.g. a field-effect transistor, a thin-film transistor, etc.), or any other suitable semiconductor device and can be used for fabricating a chip, an integrated circuit, a microelectronic device, or the like.

Electronic Devices

The present disclosure also describes electronic devices. The electronic devices can include a semiconductor device as described herein electrically integrated as part of the electronic device. Generally, the electronic device can include any electronic device employing an integrated circuit or transistor. Non-limiting examples can include a display, an amplifier, a memory device, a global positioning system (GPS) device, a server, a modem, a router, a personal computer, a laptop computer, a calculator, a tablet, a phone, a speaker, a television, a media player, an electronic reader, a projector, a smart device, a remote control, the like, or a combination thereof.

Figure 3:
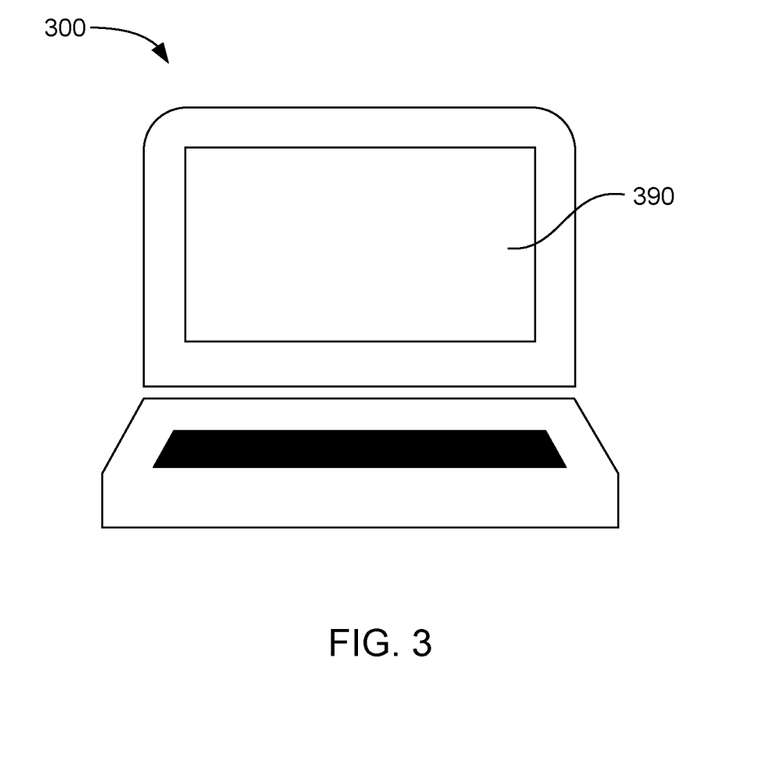
FIG. 3 is a schematic representation of an electronic device in accordance with the present disclosure.

As one non-limiting example, an electronic device 300 is illustrated in FIG. 3. The electronic device represents a laptop computer, which can include a variety of components individually including a semiconductor device as described herein. One example of a component (or individual electronic device) is a display 390. In further detail, the display can include pixel devices that can be coupled to semiconductor devices (e.g. thin-film transistors), such as those described herein. The display can include various control lines for supplying an addressable signal voltage to the semiconductor devices to influence the semiconductor devices to turn on and off to control the pixel devices to generate a visible image on the display. Various other components (or individual electronic devices) of the electronic device can also include semiconductor devices, as described herein, for performing a variety of functions.

DEFINITIONS

It is noted that, as used in this specification and the appended claims, the singular forms "a," "an," and "the" include plural referents unless the content clearly dictates otherwise.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those in the field technology to determine based on experience and the associated description herein.

As used herein, a plurality of items, structural elements, compositional elements, and/or materials may be presented in a common list for convenience. However, these lists should be construed as though individual members of the list are individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include not just include the numerical values explicitly recited as the limits of the range, but also all the individual numerical values or sub-ranges encompassed within that range as if individual numerical values and sub-ranges are explicitly recited. For example, an atomic ratio range of about 1 at % to about 20 at % should be interpreted to include nut just the explicitly recited limits of about 1 at % and about 20 at %, but also to include individual atomic percentages such as 2 at %, 11 at %, 14 at %, and sub-ranges such as 10 at % to 20 at %, 5 at % to 15 at %, etc.

The terms, descriptions, and figures used herein are set forth by way of illustration and are not meant as limitations. Many variations are possible within the disclosure, which is intended to be defined by the following claims—and equivalents—in which all terms are meant in the broadest reasonable sense unless otherwise indicated.

What is claimed is:

1. A semiconductor material comprising:
   from about 11 at % to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal;
   from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal;
   from about 0.3 at % to about 18 at % of a semiconductivity controller comprising an element having a standard electrode potential from about −0.8 to about −3.05; and
   from about 45 at % to about 67 at % oxygen.

2. The semiconductor material of claim 1, wherein the carrier mobility contributor and the amorphous phase stabilizer are present at an atomic ratio of from about 1:2 to about 50:1.

3. The semiconductor material of claim 1, wherein the carrier mobility contributor and the semiconductivity controller are present at an atomic ratio of from about 2:3 to about 150:1.

4. The semiconductor material of claim 1, wherein the amorphous phase stabilizer and the semiconductivity controller are present at an atomic ratio of from about 1:30 to about 80:1.

5. The semiconductor material of claim 1, wherein the carrier mobility contributor is lead, and the amorphous phase stability is selected from indium, tin, cadmium, zinc, gallium, or a combination thereof.

6. The semiconductor material of claim 1, wherein the carrier mobility contributor is indium, tin, cadmium, or a combination thereof, and the amorphous phase stabilizer is zinc, gallium, or a combination thereof.

7. The semiconductor material of claim 1, wherein the semiconductivity controller comprises an alkali metal, an alkaline earth metal, a lanthanide, an actinide, or a combination thereof.

8. The semiconductor material of claim 1, wherein the semiconductivity controller comprises a transition metal.

9. A semiconductor device comprising:
   a drain electrode;
   a source electrode;
   a channel connecting the drain electrode and the source electrode, said channel comprising a semiconductor material including:
      from about 11 at % to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal,
      from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal,
      from about 0.3 at % to about 18 at % of a semiconductivity controller comprising an element having a standard electrode potential from −0.8 to −3.05, and
      from about 45 at % to about 67 at % oxygen;
   a gate electrode; and
   a dielectric material positioned between the gate electrode and the channel.

10. The semiconductor device of claim 9, wherein the semiconductor device has a bottom gate structure.

11. The semiconductor device of claim 9, wherein the semiconductor device has a top gate structure.

12. The semiconductor device of claim 9, wherein the semiconductor device has a double gate structure.

13. The semiconductor device of claim 9, wherein the semiconductivity controller comprises an alkali metal, an alkaline earth metal, a lanthanide, an actinide, a transition metal, or a combination thereof.

14. An electronic device comprising a semiconductor device electrically integrated as part of the electronic device, the semiconductor device, including:
   a drain electrode;
   a source electrode;
   a channel connecting the drain electrode and the source electrode, said channel comprising a semiconductor material including:
      from about 11 at % to about 50 at % of a carrier mobility contributor selected from a period 6 metal or a period 5 metal, wherein the period 6 metal is lead and the period 5 metal is indium, tin, cadmium, or a combination thereof, and wherein the carrier mobility contributor is not a combination of the period 6 metal and the period 5 metal, from about 0.6 at % to about 25 at % of an amorphous phase stabilizer, wherein the amorphous phase stabilizer is selected from indium, tin, cadmium, zinc, gallium, or a combination thereof when the carrier mobility contributor is the period 6 metal, or the amorphous phase stabilizer is selected from zinc, gallium, or a combination thereof when the carrier mobility contributor is the period 5 metal, from about 0.3 at % to about 18 at % of a semiconductivity controller comprising an element having a standard electrode potential from about −0.8 to about −3.1, and from about 45 at % to about 67 at % oxygen;

a gate electrode; and a dielectric material positioned between the gate electrode and the channel.

15. The electronic system of claim 14, wherein the electronic device comprises a display, an amplifier, a memory device, a global positioning system (GPS) device, a server, a modem, a router, a personal computer, a laptop computer, a calculator, a tablet, a phone, a speaker, a television, a media player, a projector, a smart device, a remote control, or a combination thereof.

\* \* \* \* \*